May 2, 1961 WOO F. CHOW 2,982,866
SEMICONDUCTOR LOW-LEVEL LIMITER
Filed Dec. 24, 1956 2 Sheets-Sheet 1
FIG. 1
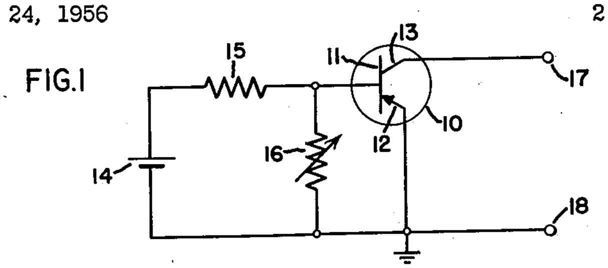
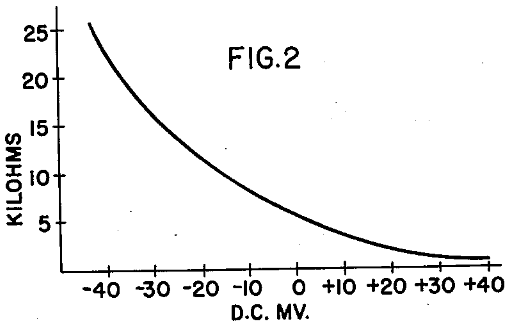
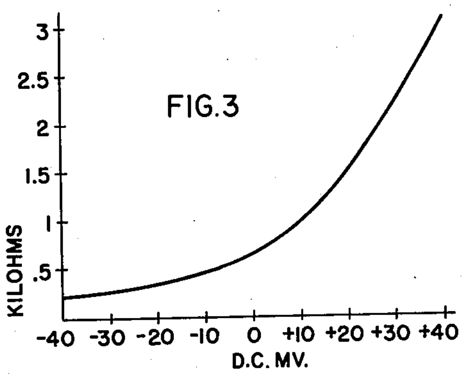
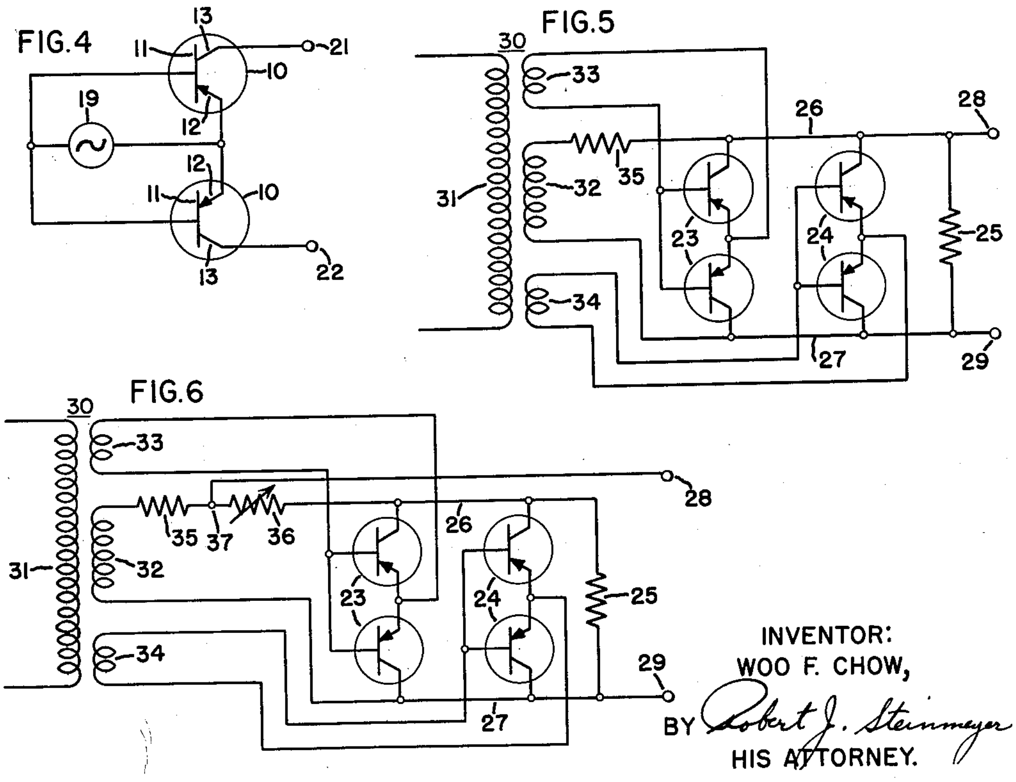
FIG. 4, FIG. 5, FIG. 6
INVENTOR:
WOO F. CHOW,
BY Robert J. Steinmeyer
HIS ATTORNEY.

May 2, 1961 WOO F. CHOW 2,982,866

SEMICONDUCTOR LOW-LEVEL LIMITER

Filed Dec. 24, 1956 2 Sheets-Sheet 2

INVENTOR:
WOO F. CHOW
BY Robert J. Steinmeyer
HIS ATTORNEY.

United States Patent Office 2,982,866
Patented May 2, 1961

2,982,866

SEMICONDUCTOR LOW-LEVEL LIMITER

Woo F. Chow, Syracuse, N.Y., assignor to General Electric Company, a corporation of New York Filed Dec. 24, 1956, Ser. No. 630,127
7 Claims. (Cl. 307—88.5)

Figure 7:
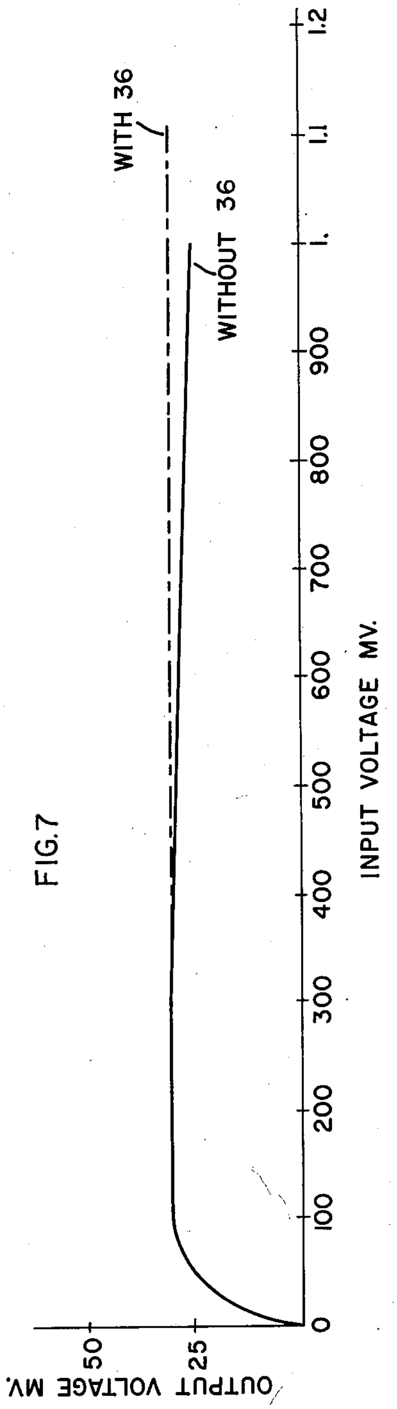

My invention relates to low-level limiting circuits and more particularly to improved low-level limiting circuits employing semiconductor devices.

In frequency modulated communication systems the intelligence is transmitted by the signal frequency deviation from the carrier frequency and any amplitude modulation of the signal is undesirable. This is especially true for narrow band frequency modulated (FM) communication where a highly selective narrow band filter is often used to get the desired selectivity. When a "raw" FM signal which has large amplitude modulation, such as modulation by impulse type noise, is fed through the selective filter without limiting, a ringing results. Unless eliminated this ringing appears as noise in the final output. Therefore, it has been conventional to introduce somewhere in the system a clipping or limiting circuit for the purpose of eliminating the ringing.

It is well known in the prior art to utilize the nonlinear properties of devices such as vacuum tubes and diodes in clipping or limiting circuits; however these properties disappear when the signal level is below about 1 or 2 volts. Accordingly, to eliminate ringing in FM communication systems as above mentioned, it has been necessary to amplify the raw FM signal to a level at which a vacuum tube or diode can be used to limit the raw signal, in other words, to remove or clip the undesired amplitude modulation. Since for a given active device the amplification per stage is higher in a narrow band amplifier than in a wide band amplifier, more stages of wide band amplification are necessary to amplify the raw FM signal to the limiting level. It is therefore highly desirable that limiting action be performed at a low level, at the millivolt or even at the microvolt range if possible. Accordingly, it is an object of my invention to provide a limiting circuit which will perform at low levels and obviate the need for extra stages of amplification previously used to raise a signal to the necessary level for clipping.

Another object of my invention is to provide a semiconductor low-level limiting circuit which will accomplish full-wave limiting.

A further object of my invention is to provide a semiconductor low-level limiting circuit which will simplify the circuitry necessary for the removal of noise, and relieve the resulting ringing, in a FM communication receiver.

In carrying out my invention in one form thereof, I provide two pairs of transistors, each of which has the bases and emitters of its component transistors connected together. Each one of the collector electrodes of each pair of transistors is connected to a collector electrode in the other pair and to one terminal of a load impedance, thus connecting the pairs in parallel with the load. This resulting parallel combination is connected in series with two resistors and a signal input. An output is taken across the series combination of one of the resistors and the parallel circuit. Two signals are derived from the signal source and applied respectively in opposite polarities across the bases and emitters of the two transistor pairs in order to modulate the impedances thereof during alternate half cycles of the signal. The level of these signals lies in the range which will most effectively modulate the impedances of the pairs and in normal usage they will be equal. The resulting impedance modulation in alternate half cycles of the two parallel paths tends to limit both the positive and negative swing of the input signal.

The novel features which I believe to be characteristic of my invention are set forth with particularity in the appended claims. My invention itself however, together with further objects and advantages thereof, can best be understood by reference to the following description taken in connection with the accompanying drawings in which Fig. 1 is a circuit diagram of a junction transistor having its base biased relative to one of the junctions and the remaining junction not biased; Fig. 2 is a graph of the variation in impedance between the terminals of the circuit in Fig. 1 for an n-p-n, rate-grown, junction transistor; Fig. 3 is a graph illustrating the variation of impedance of the circuit of Fig. 1 for a p-n-p junction transistor; Fig. 4 is a circuit diagram showing two transistors connected together in order to eliminate diode effects of the unbiased junction; Fig. 5 is a circuit diagram illustrating one embodiment of my invention with which the desired limiting action may be achieved; Fig. 6 is a circuit diagram illustrating a modified form of the embodiment of my invention shown in Fig. 5; and Fig. 7 is a graph of the input versus output voltages of the circuits of Figures 5 and 6.

Referring now to the drawings, in Fig. 1 there is shown a circuit which demonstrates an impedance variation effect. The illustrated circuit comprises a junction transistor 10 having a base electrode 11 and two junction electrodes 12 and 13. A source of base biasing potential 14 is connected from junction electrode 12 through an impedance 15 to base electrode 11. A variable impedance 16 is connected from junction electrode 12 to base electrode 11. Two output terminals 17 and 18 are connected to junction electrodes 13 and 12 respectively.

The effect of the circuit of Fig. 1 is to bias the base 11 with respect to junction 12. The other junction 13 is not biased and the A.C. impedance measured between the terminals 17 and 18 varies with the base bias. This variation occurs predominantly at the biased junction 12 with little effect at the unbiased junction 13. The base bias may be varied by adjusting variable impedance 16.

This variation in the A.C. impedance between the terminals 17 and 18 in Fig. 1 is illustrated in the graph of Fig. 2 for an n-p-n, rate-grown, junction transistor. It can be seen that there is a substantial variation in the resistance over a D.C. range of the order of millivolts in bias. The graph of Fig. 3 similarly shows the variation of A.C. impedance across the terminals 17 and 18 in the circuit of Fig. 1 for a p-n-p junction transistor. Again, a substantial variation in resistance occurs in the millivolt bias range. The junction transistor is particularly suited to the circuit of my invention because of the signal range over which the impedance variation occurs. The corresponding variation of impedance of the point contact types occurs at a higher signal level, and thus these types are less readily adaptable to the circuits of my invention. No diode effects at the unbiased junction appears in Figures 2 and 3, because it does not become appreciable until a voltage level of approximately 100 mv. is reached.

In order to double the total impedance variation obtainable across the output terminals and to limit any diode effects of the unbiased junction 13 at higher signal levels, I provide the circuit of Fig. 4 which includes two transistors 10, similar to the junction transistor 10 of Fig. 1, connected with the bases 11 conductively tied together and the junction terminals 12 also conductively tied together. A bias source 19 is connected across the bases 11 and the junctions 12. The junctions 13 are connected to a pair of output terminals 21 and 22.

In the circuit of Fig. 4 the application of the bias 19 across the bases 11 and the junctions 12 yields a variation in A.C. impedance across the transistors 10 similar to that illustrated in Figures 2 and 3. A resultant total variation in A.C. impedance is obtained across output terminals 21 and 22. This variation occurs predominantly between the electrodes 11 and 12 of the two transistors 10 and is additive. Moreover, the circuit of Fig. 4 balances out the diode effects of the two unbiased junctions 13, in order to improve linearity. This balancing out is apparent when it is considered that, when viewing the circuit from terminals 21 and 22, the path through the two transistors is in one direction through one junction 13 and in the opposite direction through the other. The diode effects of an unbiased junction in any event is not noticeable until a voltage level of approximately 100 mv. is reached, but balancing out is desirable to eliminate second order effects and thereby optimize limiting control.

Early junction transistors often employed collector and emitter regions which did not differ greatly. With this type of transistor it would not be necessary to connect a particular junction of one of the transistors 10 of Fig. 4 to the other as is illustrated by the connection between the junctions 12. However, since the circuits of my invention are designed to operate in the megacycle range if desired and since the advent of newer types of junction transistors which have improved high frequency characteristics due to a difference in the doping of the emitter and collector regions, it is desirable to connect the emitter electrodes in the positions of the junctions 12 of Fig. 4 in order to realize the maximum available efficiency of the circuit.

In order to use the impedance variations present in Fig. 4 in alternate half cycles and to achieve full-wave limiting, I have incorporated two such circuits in the embodiment shown in Fig. 5. Two pair of transistors 23 and 24 similar to those in Fig. 4, have been connected as in Fig. 4. These transistor pairs 23 and 24 are connected in parallel with a load impedance 25 across lines 26 and 27 which terminate in output terminals 28 and 29. A signal means or coupling transformer 30, having an input winding 31, a main output winding 32 and two auxiliary output windings 33 and 34 is used to activate the circuit. The main output winding 32 supplies a signal to the parallel combination of the transistor pairs 23 and 24 and the load impedance 25 through a series impedance 35. The input signal is applied to the winding 31. Auxiliary output winding 33 is connected across the base and common junction electrodes of the transistor pair 23 and auxiliary winding 34 is connected across the base and common junction terminal of the transistor pair 24. These connections are made in such a manner as to bias transistor pairs 23 and 24 into the region of impedance modulation in order to modulate the impedance of one pair on one half cycle and the other pair on the following half cycle.

The circuit of Fig. 5 serves to limit an input signal applied to input winding 31 by means of the impedance variations in the transistor pairs 23 and 24. The output appears across the terminals 28 and 29 and is a result of the effects of the impedance variations in combination with potential divider action due to resistor 35.

The circuit of Fig. 5 may be modified as is shown in Fig. 6 in order to further optimize the limiting action. The circuit of Fig. 6 is identical to that of Fig. 5 with the exceptions that an additional resistor 36 is connected in series with resistor 35 and the main output winding 32 to the parallel combination across the lines 26 and 27, and that the output in the circuit of Fig. 6 is taken across the terminals 28 and 29, the terminal 28 now being connected to a point 37 between resistors 35 and 36.

The advantages of the embodiment shown in Fig. 6 are to further modify the potential divider action of the circuit in order to maintain the output signal more uniform at higher signal voltages than can be done with the circuit of Fig. 5. This may be necessary at higher signal levels where the impedances of the transistor pair being modulated become sufficiently small.

Typical sets of values for the circuits of Figures 5 and 6 are as follows:

| | |
|---|---|
| Transistor type | 2N78. |
| Resistance 25 | 2000 ohms. |
| Resistance 35 | 470 ohms. |
| Resistance 36 | 1000 ohms variable. |

*Transformer 30*

| | | |
|---|---|---|
| Winding 31 | $\mu$h | 500 |
| Winding 32 | $\mu$h | 500 |
| Winding 33 | mh | 2 |
| Winding 34 | mh | 2 |

*Turns ratios of transformer 30*

| | |
|---|---|
| Winding 31 to winding 32 | 1 to 1 |
| Winding 31 to winding 33 | 1 to 4 |
| Winding 31 to winding 34 | 1 to 4 |

The operation of the circuits of Figures 5 and 6 is illustrated in the graph of Fig. 7 which shows the output versus input voltage characteristics for both the circuits. It can be seen that the additional resistor 36 begins to become effective around a 400 millivolt level and keeps the output substantially constant up to over 1.1 volts input. These characteristics were taken at 1 megacycle. Similar results have been obtained at 100 and 500 kilocycles.

It can thus be seen that the circuits of Fig. 5 and Fig. 6 may be used to limit an input signal in the frequency range employed in FM communication systems and will thus effectively reduce the ringing which results from AM noise present in an FM receiver amplifier.

While I have shown particular embodiments of my invention, it will be understood, of course, that I do not wish to be limited thereto since many modifications may be made, and I therefore contemplate by the appended claims to cover any such modifications as fall within the true spirit and scope of my invention.

What I claim as new and desire to secure by Letters Patent of the United States is:

1. A semiconductor low-level limiting circuit comprising two junction transistors each having a base and first and second junction electrodes, a source of signal voltage, means interconnecting said base electrodes, means interconnecting said first junction electrode of each of said transistors, means for applying a portion of said signal voltage proportional to the amplitude thereof between said base electrodes and said first junction electrodes, said portion having an order of magnitude sufficient to modulate the impedance across said second junctions of said transistors, means for connecting said source of signal voltage between said respective second junction electrodes and means for taking an output across said second junction electrodes, whereby variations in said impedance will serve to limit said output.

2. A semiconductor low-level limiting circuit comprising two pair of junction transistors each having a base and first and second junction electrodes, means interconnecting said first junctions of each pair of said transistors, means interconnecting said bases of each pair of said transistors, means connecting said pairs in parallel at said second junctions, a source of A.C. signal voltage, means for connecting said signal voltage source across said second junctions, means for applying a portion of said signal in one polarity across the bases and first junctions of one of said pairs for modulating the impedance thereof, means for applying a portion of said signal of opposite polarity across the bases and first junctions of the other of said pairs whereby the biases applied to said pairs will reduce the impedance across said second junctions of one pair on one half cycle and the other pair on the next half cycle, and means for taking an output from across said second junctions whereby alternate variations in the impedances of said pairs will serve to limit said output.

3. A semiconductor low-level limiting circuit comprising two pair of junction transistors each having a base and first and second junction electrodes, means interconnecting said first junctions of each pair of said transistors, means interconnecting said bases of each pair of said transistors, means connecting said pairs in parallel at said second junctions, a source of A.C. signal voltage, a resistor, means for connecting said signal voltage source in series with said resistor across said second junctions, means for applying a portion of said signal in one polarity across the bases and first junctions of one of said pairs in order to modulate the impedance thereof, means for applying a portion of said signal of opposite polarity across the bases and first junctions of the other of said pairs whereby the biases applied to said pairs will reduce the impedance across said second junctions of one pair on one half cycle and the other pair on the next half cycle, and means for taking an output from across said second junctions whereby alternate variations in the impedances of said pairs will serve to limit said output.

4. A semiconductor low-level limiting circuit comprising two pair of junction transistors each having a base and first and second junction electrodes, means interconnecting said first junctions of each pair of said transistors, means interconnecting said bases of each pair of said transistors, means connecting said pairs in parallel at said second junctions, a source of A.C. signal voltage, two resistors, means for connecting said signal voltage source in series with said resistors across said second junctions, means for applying a portion of said signal in one polarity across the bases and first junctions of one of said pairs, means for applying a portion of said signal of opposite polarity across the bases and first junctions of the other of said pairs whereby the biases applied to said pairs will reduce the impedance across said second junctions of one pair on one half cycle and the other pair on the next half cycle, and means for taking an output from across the series combination of one of said resistors and said second junctions whereby alternate variations in the impedances of said pairs will serve to limit said output.

5. A semiconductor low-level limiting circuit comprising two pair of junction transistors each having a base and first and second junction electrodes, means interconnecting said first junctions of each pair of said transistors, means interconnecting said bases of each pair of said transistors, means connecting said pairs in parallel at said second junctions, a source of A.C. signal voltage, two resistors, means for connecting said signal voltage source in series with said resistors across said second junctions, means for applying a portion of said signal in one polarity across the bases and first junctions of one of said pairs, means for applying a portion of said signal of opposite polarity across the bases and first junctions of the other of said pairs whereby the biases applied to said pairs will reduce the impedance across said second junctions of one pair on one half cycle and the other pair on the next half cycle, a load impedance connected in parallel across said second junctions, and means for taking an output from across the series combination of one of said resistors and the parallel circuit across said second junctions whereby alternate variations in the impedances of said pairs will serve to limit said output.

6. A semiconductor low-level limiting circuit comprising two pair of junction transistors each having a base and first and second junction electrodes, means interconnecting said first junctions of each pair of said transistors, means interconnecting said bases of each pair of said transistors, means connecting said pairs in parallel at said second junctions, a source of alternating signal voltage, a coupling transformer having an input winding and a main and two auxiliary output windings inductively intercoupled, means for connecting said signal voltage source across said input winding, two resistors, means connecting said main output winding in series with said resistors across said second junctions, means for connecting one of said auxiliary windings across the bases and first junctions of one of said pairs, means for connecting the other of said auxiliary windings in the opposite sense to said one across the bases and first junctions of the other of said pairs whereby the biases applied to said pairs will reduce the impedance across said second junctions of one pair on one half cycle and the other pair on the next half cycle, a load impedance connected in parallel across said second junctions, and means for taking an output across the series combination of one of said resistors and the parallel circuit across said second junctions, whereby alternate variations in the impedances of said pairs will serve to limit said output.

7. A semiconductor low-level limiting circuit comprising two pair of junction transistors each having base, emitter and collector electrodes; means interconnecting said emitters of each pair of said transistors; means interconnecting said bases of each pair; means connecting said pairs in parallel at said collectors; a source of A.C. signal voltage; a coupling transformer having an input winding and a main and two auxiliary output windings inductively intercoupled; means connecting said signal voltage source across said input winding; two resistors, means connecting said main output winding in series with said resistors across said collectors; means for connecting one of said auxiliary windings across the bases and emitters of one of said pairs; means connecting the other of said auxiliary windings in the opposite sense to said one across the bases and emitters of the other of said pairs whereby the biases applied to said pairs will reduce the impedance across said collectors of one pair on one half cycle and the other pair on the next half cycle; a load impedance connected in parallel across said collectors; and means for taking an output across the series combination of one of said resistors and the parallel circuit across said collectors whereby alternate variations in the impedances of said pairs will serve to limit said outputs.

References Cited in the file of this patent

UNITED STATES PATENTS

| | | |
|---|---|---|
| 2,144,995 | Pulvermacher | Jan. 24, 1939 |
| 2,285,044 | Morris | June 2, 1942 |
| 2,345,026 | Boykin | Mar. 28, 1944 |
| 2,751,545 | Chase | June 19, 1956 |
| 2,767,365 | Guggi | Oct. 16, 1956 |
| 2,802,167 | Cooper | Aug. 6, 1957 |
| 2,821,639 | Bright et al. | Jan. 28, 1958 |
| 2,850,236 | Schaefer et al. | Sept. 2, 1958 |
| 2,850,650 | Meacham | Sept. 2, 1958 |
| 2,864,978 | Frank | Dec. 16, 1958 |
| 2,899,571 | Myers | Aug. 11, 1959 |